(12) United States Patent
Wu et al.

(10) Patent No.: US 11,749,744 B2
(45) Date of Patent: Sep. 5, 2023

(54) FIN STRUCTURE FOR VERTICAL TRANSPORT FIELD EFFECT TRANSISTOR

(71) Applicant: International Business Machines Corporation, Armonk, NY (US)

(72) Inventors: Heng Wu, Guilderland, NY (US); Lan Yu, Voorheesville, NY (US); Dechao Guo, Niskayuna, NY (US); Junli Wang, Slingerlands, NY (US); Ruqiang Bao, Niskayuna, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 17/341,480

(22) Filed: Jun. 8, 2021

(65) Prior Publication Data
US 2022/0393019 A1 Dec. 8, 2022

(51) Int. Cl.
| | | |
|---|---|---|
| *H01L 29/66* | (2006.01) | |
| *H01L 29/78* | (2006.01) | |
| *H01L 29/10* | (2006.01) | |
| *H01L 29/08* | (2006.01) | |
| *H01L 29/06* | (2006.01) | |

(52) U.S. Cl.
CPC .... *H01L 29/66666* (2013.01); *H01L 29/0692* (2013.01); *H01L 29/0847* (2013.01); *H01L 29/1037* (2013.01); *H01L 29/7827* (2013.01); *H01L 29/0653* (2013.01)

(58) Field of Classification Search
CPC ........... H01L 29/66666; H01L 29/0692; H01L 29/0847; H01L 29/1037; H01L 29/7827; H01L 29/0653
USPC .......................................................... 257/329
See application file for complete search history.

(56) References Cited

U.S. PATENT DOCUMENTS

| | | | | |
|---|---|---|---|---|
| 8,633,529 | B2 * | 1/2014 | Juengling | H01L 27/1052 257/302 |
| 9,496,259 | B2 * | 11/2016 | Chien | H01L 27/0924 |
| 9,786,788 | B1 | 10/2017 | Anderson et al. | |
| 9,882,002 | B2 | 1/2018 | Tseng et al. | |
| 9,964,605 | B2 * | 5/2018 | Chi | H01L 29/82 |

(Continued)

FOREIGN PATENT DOCUMENTS

EP 1794791 A1 6/2007

OTHER PUBLICATIONS

Toure et al., "H-shaped Vertical Polycrystalline Silicon Thin Film Transistor on Insulator", ECS Transactions, 19 (4) 195-200 (2009), 10.1149/1.3117409, © The Electrochemical Society, 6 pages. http://citeseerx.ist.psu.edu/viewdoc/download?doi=10.1.1.891.1475&rep=rep1&type=pdf.

*Primary Examiner* — Mohammad M Hoque
(74) *Attorney, Agent, or Firm* — Jeffrey M. Ingalls

(57) ABSTRACT

A semiconductor device is provided. The semiconductor device includes a bottom source/drain; a top source/drain; a fin provided between the bottom source/drain and the top source/drain, the fin including a first fin structure and a second fin structure that are symmetric to each other in a plan view. Each of the first and second fin structures includes a main fin extending laterally in a first direction, and first and second extension fins extending laterally from the main fin in a second direction perpendicular to the first direction. The main fin extends laterally in the first direction beyond where the first and second extension fins connect to the main fin.

9 Claims, 17 Drawing Sheets

(56) References Cited

U.S. PATENT DOCUMENTS

| | | |
|---|---|---|
| 10,096,706 B2 | 10/2018 | Wang et al. |
| 10,340,364 B2 | 7/2019 | Zhang et al. |
| 10,622,476 B2 | 4/2020 | Park et al. |
| 11,043,564 B2* | 6/2021 | Do .................. H01L 21/823885 |
| 11,456,181 B2* | 9/2022 | Cheng ................. H01L 21/3086 |
| 2003/0042542 A1* | 3/2003 | Maegawa ............. H01L 29/785 |
| | | 257/773 |
| 2013/0214332 A1* | 8/2013 | Wu ...................... G01N 27/414 |
| | | 257/253 |
| 2013/0229223 A1* | 9/2013 | Shrivastava .......... H01L 29/102 |
| | | 327/438 |
| 2016/0276350 A1* | 9/2016 | Zang ............... H01L 21/823828 |
| 2019/0067474 A1 | 2/2019 | Wong et al. |
| 2019/0148516 A1* | 5/2019 | Zhang ................. H01L 21/3081 |
| | | 257/329 |
| 2020/0403086 A1 | 12/2020 | Kim et al. |
| 2020/0403096 A1* | 12/2020 | Jung .................... H01L 27/085 |
| 2021/0111271 A1* | 4/2021 | Kim .................... H01L 21/0337 |

\* cited by examiner

A-A'

B-B'

A-A'

B-B'

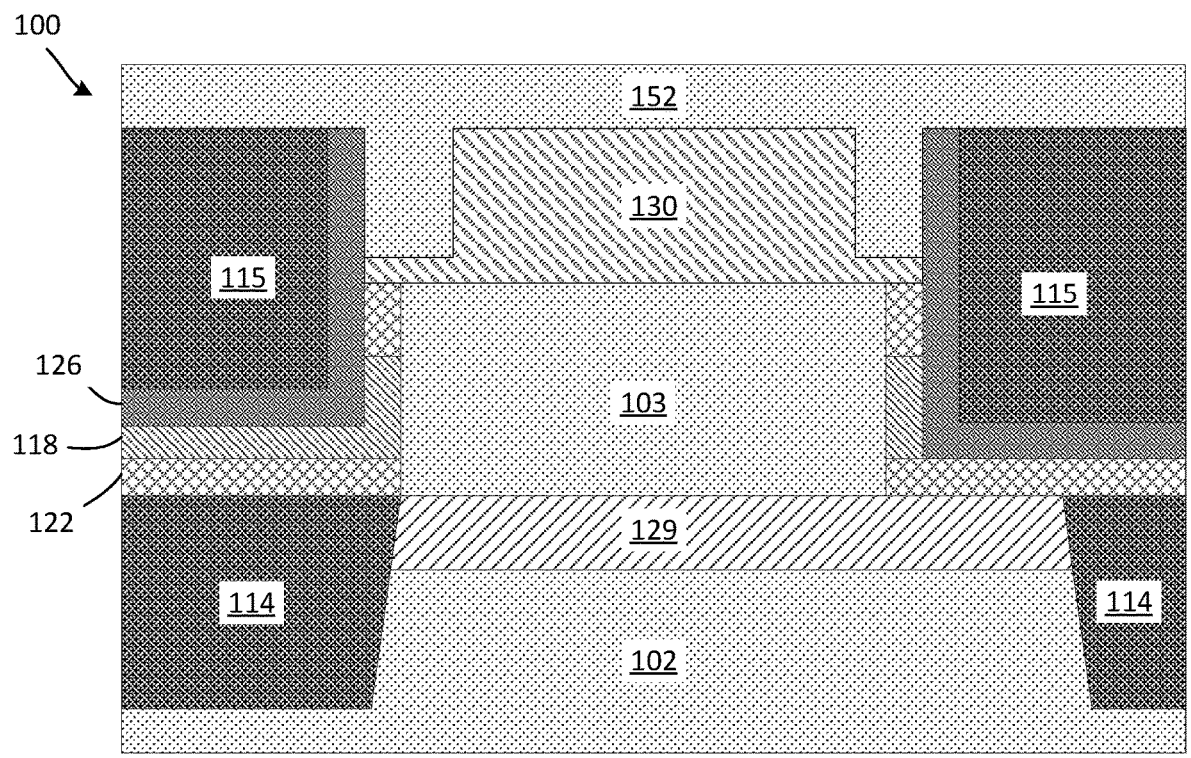
A-A'   FIG. 10B
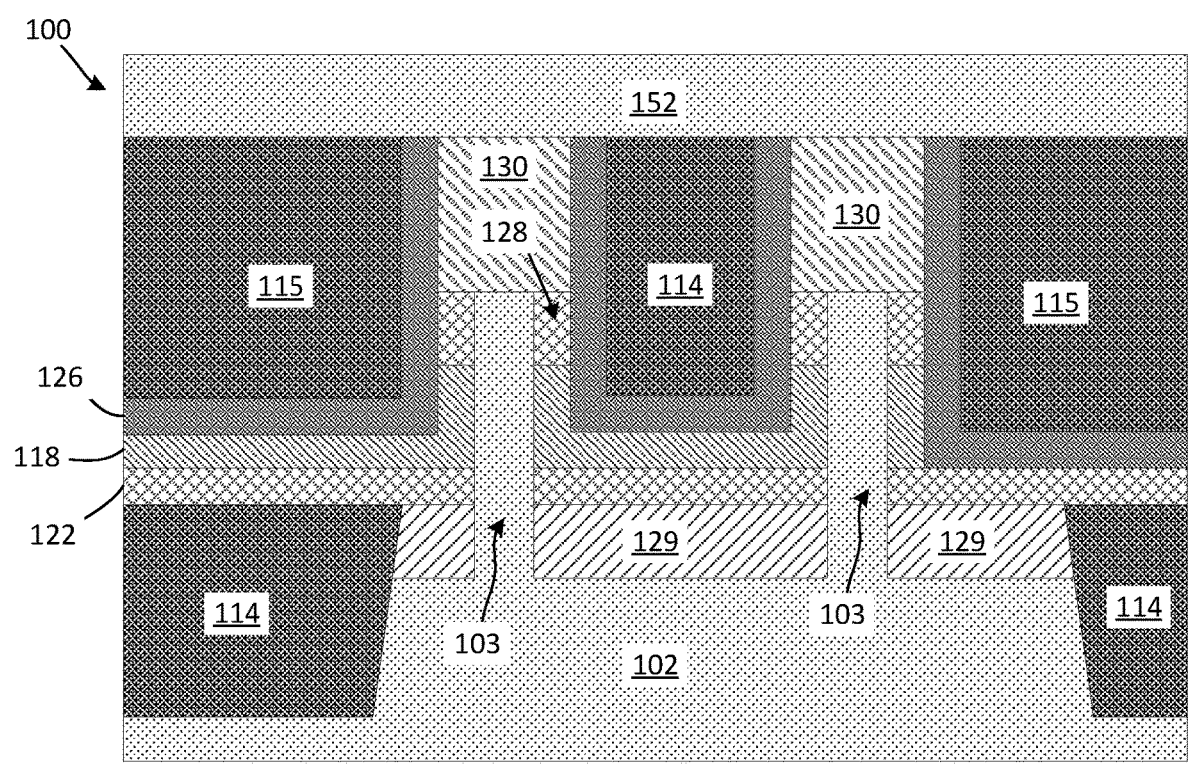
B-B'   FIG. 10C

FIN STRUCTURE FOR VERTICAL TRANSPORT FIELD EFFECT TRANSISTOR

BACKGROUND

The present disclosure relates to fabrication methods and resulting structures for semiconductor devices. More specifically, the present disclosure relates to fabrication methods and resulting structures for vertical transport field-effect transistors (VTFETs) including a symmetrical fin structure.

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction.

VTFETs are becoming viable device options for smaller scale semiconductor devices, such as, for example, devices beyond the 7 nanometer (nm) node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

VTFET devices provides viable solutions for transistor scaling. With current flowing in the vertical direction, the gate length and source/drain dimension are not limited by the lateral scaling. As determined by the structure, the gate width of VTFET is determined by the Fin perimeter. How to increase the gate width at constant lateral footprint may be an important research topic.

SUMMARY

Embodiments of the present disclosure relate to a semiconductor device. A semiconductor device is provided. The semiconductor device includes a bottom source/drain; a top source/drain; a fin provided between the bottom source/drain and the top source/drain, the fin including a first fin structure and a second fin structure that are symmetric to each other in a plan view. Each of the first and second fin structures includes a main fin extending laterally in a first direction, and first and second extension fins extending laterally from the main fin in a second direction perpendicular to the first direction. The main fin extends laterally in the first direction beyond where the first and second extension fins connect to the main fin.

Embodiments of the present disclosure relate to a method of manufacturing a semiconductor device. The method includes: forming a bottom source/drain; forming a top source/drain; forming a fin between the bottom source/drain and the top source/drain, the fin including a first fin structure and a second fin structure that are symmetric to each other in a plan view, wherein each of the first and second fin structures includes a main fin extending laterally in a first direction, and first and second extension fins extending laterally from the main fin in a second direction perpendicular to the first direction, and wherein the main fin extends laterally in the first direction beyond where the first and second extension fins connect to the main fin.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

FIG. 2B is a cross-sectional view of FIG. 2A taken along line X, according to embodiments.

FIG. 3B is a cross-sectional view of FIG. 3A taken along line X, according to embodiments.

FIG. 4B is a cross-sectional view of FIG. 4A taken along line X, according to embodiments.

FIG. 5B is a cross-sectional view of FIG. 5A taken along line X, according to embodiments.

FIG. 6B is a cross-sectional view of FIG. 6A taken along line X, according to embodiments.

FIG. 8B is a cross-sectional view of FIG. 8A taken along line A-A', and where FIG. 8C is a cross-sectional view of FIG. 8A taken along line B-B', according to embodiments.

FIG. 9B is a cross-sectional view of FIG. 9A taken along line A-A', and where FIG. 9C is a cross-sectional view of FIG. 9A taken along line B-B', according to embodiments.

FIGS. 10A, 10B and 10C are a top-down view and two different cross-sectional views of the semiconductor device of FIGS. 9A, 9B and 9C after additional fabrication operations including deposition of a dielectric fill layer, where FIG. 10B is a cross-sectional view of FIG. 10A taken along line A-A', and where FIG. 10C is a cross-sectional view of FIG. 10A taken along line B-B', according to embodiment.

FIG. 11B is a cross-sectional view of FIG. 11A taken along line A-A', and where FIG. 11C is a cross-sectional view of FIG. 11A taken along line B-B', according to embodiments.

DETAILED DESCRIPTION

Figure 1:
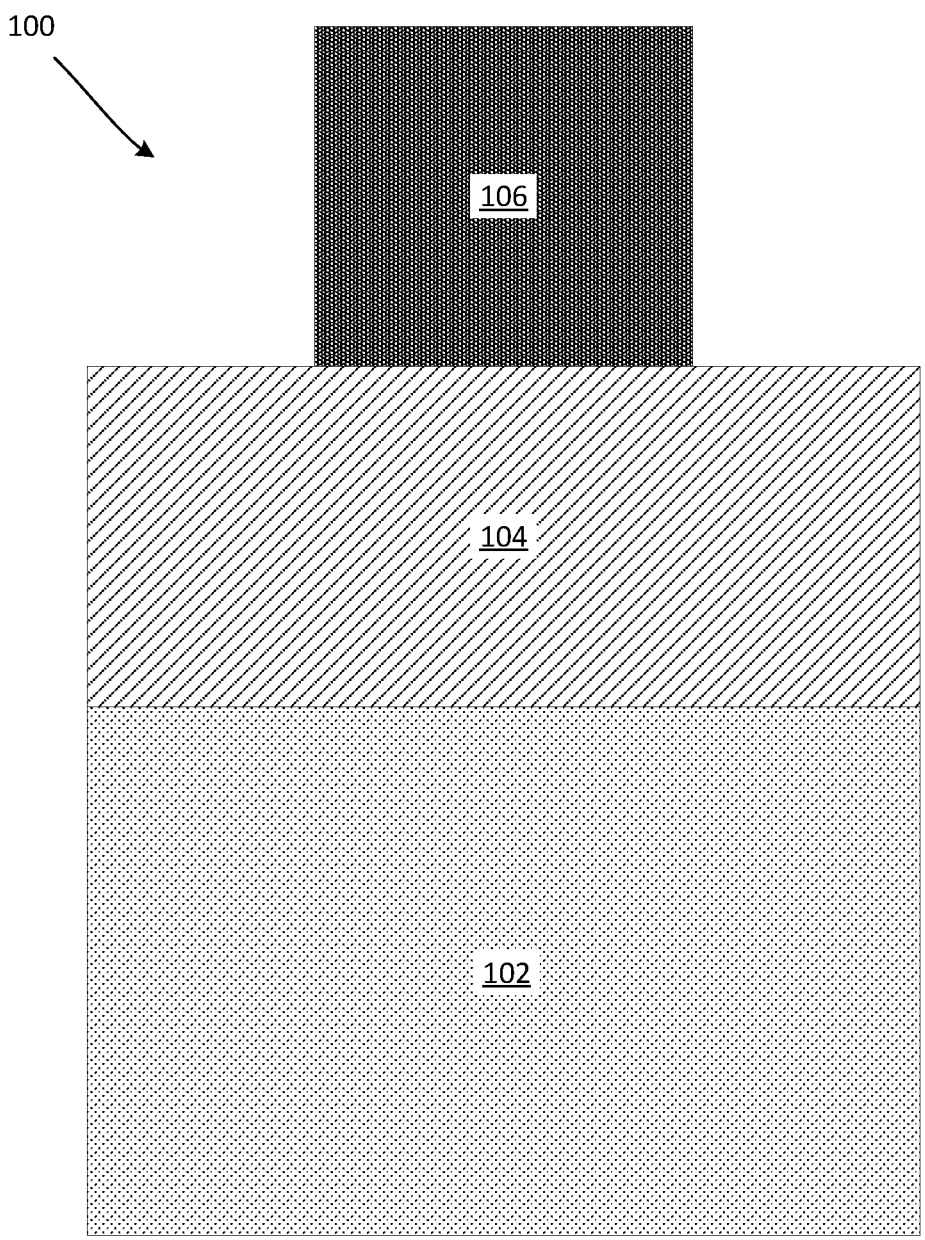
FIG. 1 is a cross-sectional view of a semiconductor device illustrating mandrel and spacer formation at an intermediate stage of the manufacturing process, according to embodiments.

Exemplary embodiments will now be discussed in further detail with regard to semiconductor devices and methods of manufacturing same and, in particular, to VTFET devices including bottom source/drain regions under fin channel regions, fin channel regions having a ladder shape, and top source/drain regions.

A "C" shaped field effect transistor (CFET) is a promising device design for the VTFET and may be able to achieve an increased effective transistor width (Weft) relative to related technologies. In the current self-aligned gate contact (CB) design, the top epitaxial layer may need to be cut to leave a suitable margin for the CB landing. However, with the removal of portions of the top epitaxial layer for a VFET, the CFET may suffer from a transistor on-state resistance ($R_{on}$) degradation due to the fact that the epitaxial layer is removed in a part of the fin. Thus, the device may suffer from a large device asymmetry due to this material removal process and huge performance loss.

In the present disclosure, embodiments relate to a ladder shaped VTFET design that may overcome the EB cut issue in related CFET designs, without needing to remove large portions of the top epitaxial layer. Therefore, it may be desirable to manufacture VTFETs with modified fin shapes (e.g., a ladder shaped design) that allow for a reduction in the amount of material that must be removed from the subsequently grown top epitaxial layer.

It is to be understood that the various layers and/or regions shown in the accompanying drawings are not drawn to scale, and that one or more layers and/or regions of a type commonly used in, for example, FinFET, VTFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VTFETs, CMOSs, FETs, nanowire FETs, nanosheet FETs, SETs, and/or MOSFETs. By way of a non-limiting example, the semiconductor devices can include, but are not necessarily limited to FinFET, VTFET, CMOS, FET, nanowire FET, nanosheet FET, SET, CMOS and MOSFET devices, and/or semiconductor devices that use FinFET, VTFET, CMOS, FET, nanowire FET, nanosheet FET, SET, CMOS and/or MOSFET technology.

The flowcharts and cross-sectional diagrams in the Figures illustrate methods of manufacturing nanosheet FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Referring now to the drawings in which like numerals represent the same or similar elements and initially to FIG. 1, this figure is a cross-sectional view of a semiconductor device 100 illustrating mandrel and spacer formation at an intermediate stage of the manufacturing process, according to embodiments. As shown in FIG. 1, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer.

A hardmask layer 104 (or fin hardmask layer) including, for example, a nitride material, such as, but not necessarily limited to, silicon nitride (SiN) or titanium nitride (TiN), is formed on the substrate 102. The hardmask layer 104 can be deposited using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. In some embodiments, a planarization process, such as, chemical mechanical planarization (CMP) can be used to remove excess hardmask layer 104 material. A height of the hardmask layer 104 can be in the range of, but is not necessarily limited to, 20 nm to 100 nm. It should be appreciated that the hardmask layer 104 may include one layer or a plurality of sublayers.

A plurality of mandrels 106 comprising, but not necessarily limited to, amorphous silicon (a-Si), amorphous carbon, polycrystalline silicon, polycrystalline silicon germanium, amorphous silicon germanium, polycrystalline germanium, and/or amorphous germanium, are formed on hardmask layer 105 to be spaced apart from each other. The mandrel 106 formation can be done by various patterning techniques, including, but not necessarily limited to, lithography patterning followed by directional etching and/or a sidewall image transfer (SIT) process, for example. In some embodiments, the process includes using lithography followed by directional etching (e.g., reactive ion etch (RIE)) to form mandrels 106.

Figure 2B:
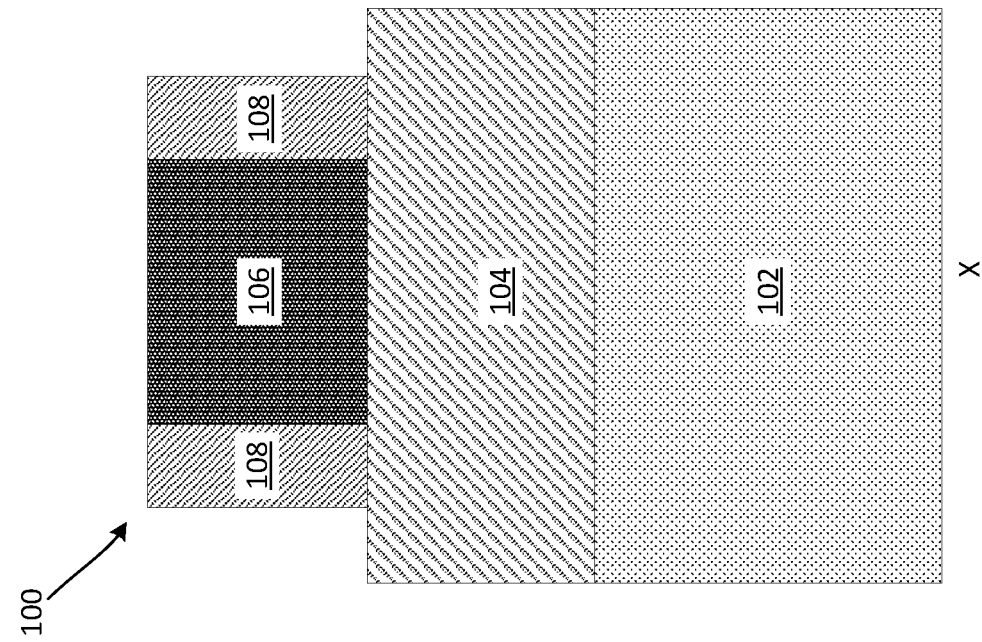
FIGS. 2A and 2B are a top-down view and cross-sectional view of the semiconductor device of FIG. 1 after additional fabrication operations, where
Figure 2A:
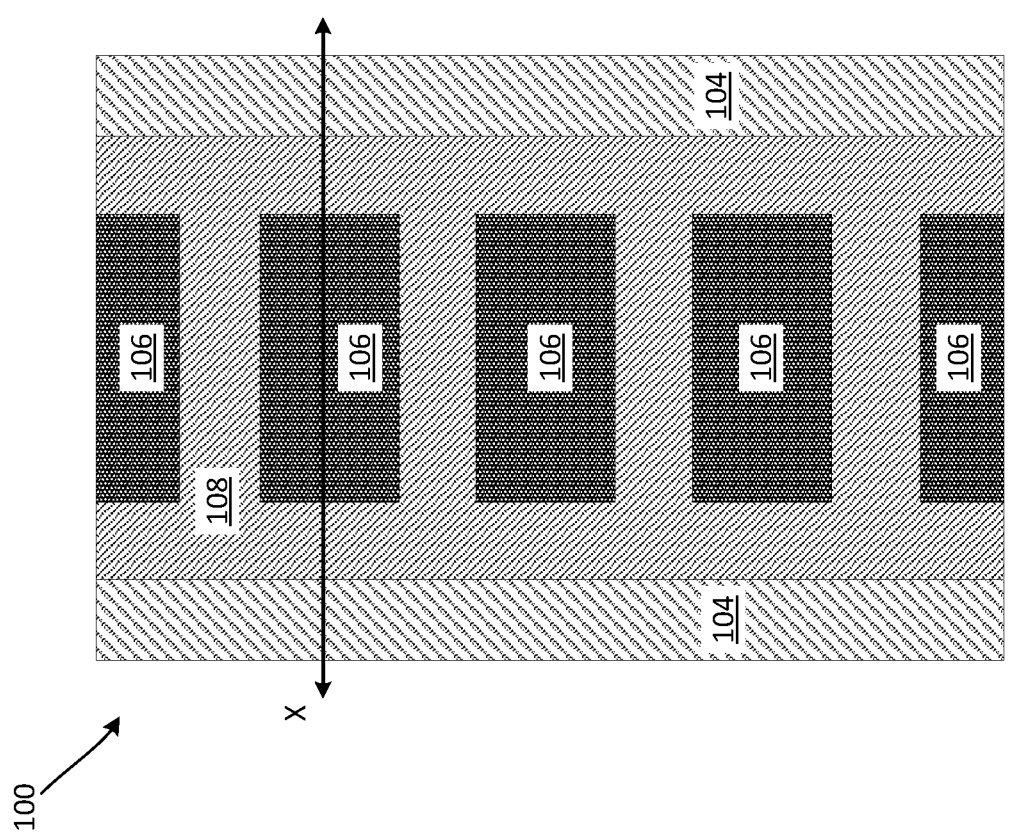

Referring now to FIGS. 2A and 2B, these figures are a top-down view and cross-sectional view of the semiconductor device of FIG. 1 after additional fabrication operations, where FIG. 2B is a cross-sectional view of FIG. 2A taken along line X, according to embodiments. After mandrel 106 formation, a conformal film can be deposited and then followed by an etchback process (e.g., RIE). The conformal film will form spacers 108 around vertical sides of each mandrel 106. The spacer 108 material can include, but is not limited, an oxide, such as silicon oxide ($SiO_x$) (where x is, for example, 2 in the case of silicon dioxide ($SiO_2$), or 1.99 or 2.01), formed by low-pressure chemical vapor deposition (LPCVD), PECVD, sub-atmospheric chemical vapor deposition (SACVD), rapid thermal chemical vapor deposition (RTCVD), in-situ radical assisted deposition, high temperature oxide (HTO) deposition, low temperature oxide (LTO) deposition, ozone/TEOS deposition, limited reaction processing CVD (LRPCVD). Alternatively, some other dielectric materials, such as SiOCN, SiCN, SiOC, can be used as the material for the spacers 108. A height of the mandrels 106 and corresponding spacers 108 can be in the range of, but is not necessarily limited to, 30 nm to 100 nm. As shown in the top-down view of FIG. 2A, the spacer 108 has a ladder shape mentioned above, and a processed form of this configuration will be used to form the ladder shaped fins as discussed in further detail below.

Figure 3B:
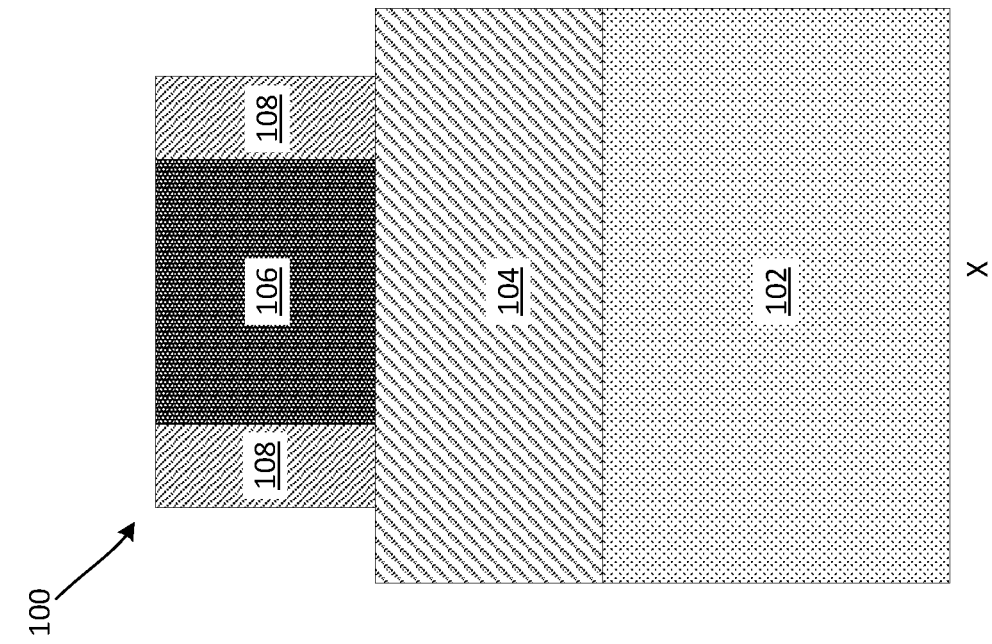
FIGS. 3A and 3B are a top-down view and cross-sectional view of the semiconductor device of FIGS. 2A and 2B respectively after additional fabrication operations, where
Figure 3A:
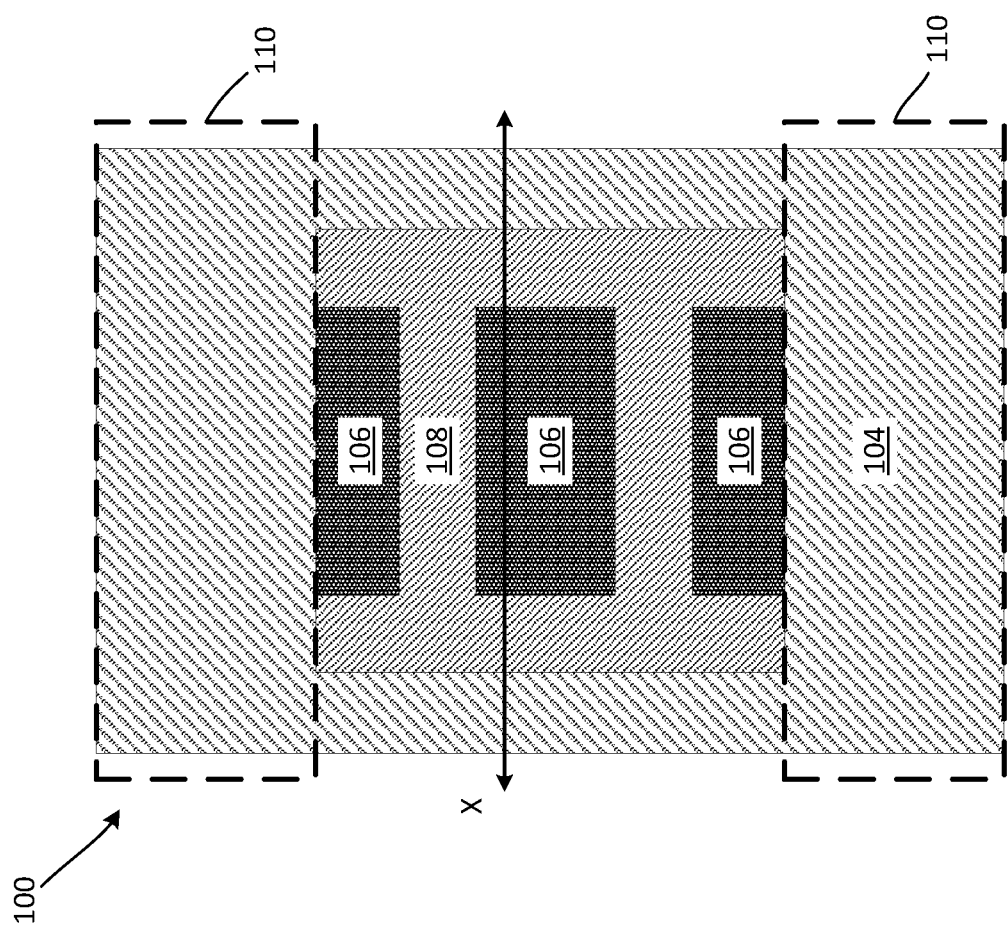

Referring now to FIGS. 3A and 3B, these figures are a top-down view and cross-sectional view of the semiconductor device of FIGS. 2A and 2B respectively after additional fabrication operations, where FIG. 3B is a cross-sectional view of FIG. 3A taken along line X, according to embodiments. As shown in FIGS. 3A and 3B, peripheral portions 110 of the mandrels 106 and spacers 108 are removed to form spaces between adjacent spacers 108 on the mandrels 106 and to further refine the ladder shape of the spacers 108. The openings expose portions of a top surface of the hardmask layer 104 and are formed using an etching process such as, for example, a plasma dry etch. The mandrels 106 and spacers 108 are formed on the hardmask layer 104 in p-type FET (PFET) and n-type FET (NFET) regions of the semiconductor device 100, where respective PFET and NFET devices will be formed.

Figure 4B:
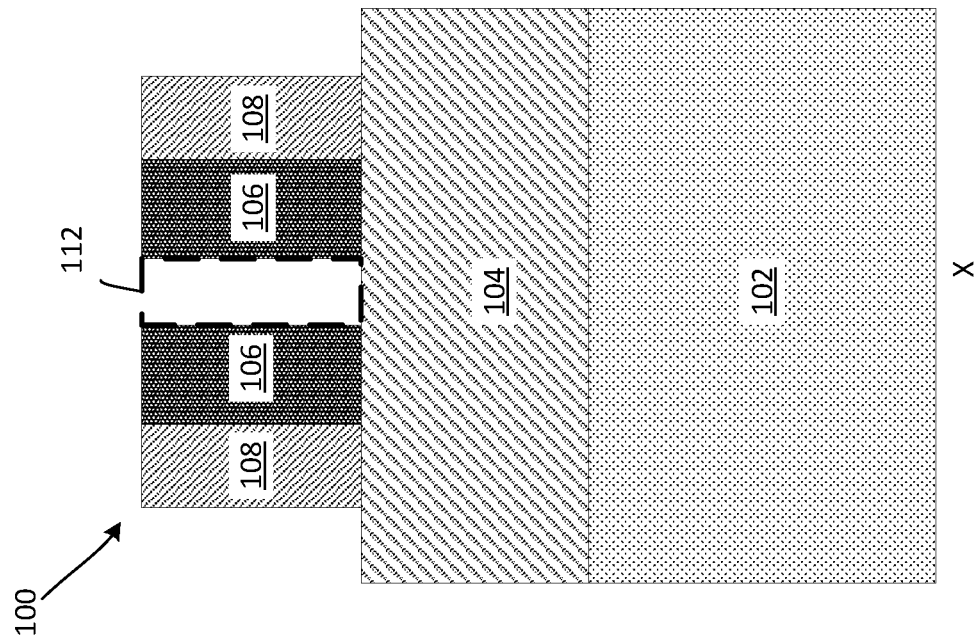
FIGS. 4A and 4B are a top-down view and cross-sectional view of the semiconductor device of FIGS. 3A and 3B respectively after additional fabrication operations, where
Figure 4A:
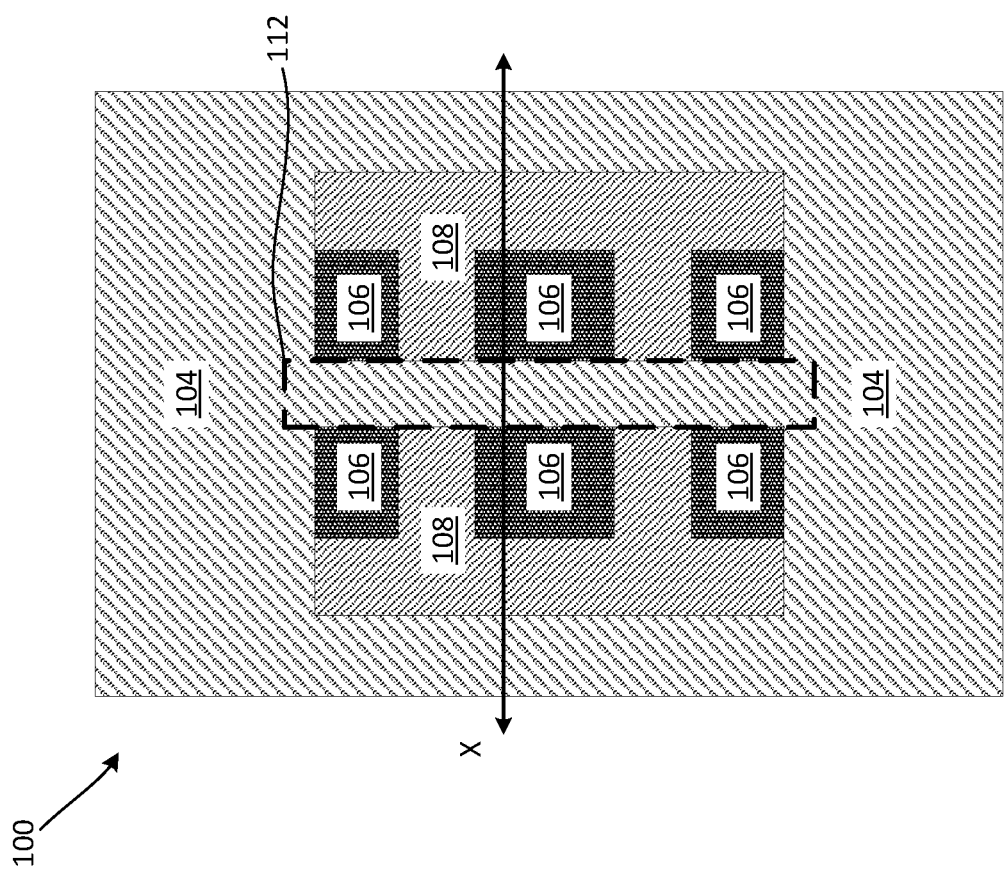

Referring now to FIGS. 4A and 4B, these figures are a top-down view and cross-sectional view of the semiconductor device of FIGS. 3A and 3B respectively after additional fabrication operations, where FIG. 4B is a cross-sectional view of FIG. 4A taken along line X, according to embodiments. As shown in FIGS. 4A and 4B, a central portion 112 of the mandrels 106 and spacers 108 are removed with a second to form spaces between right and left side portions of the spacers 108 and the mandrels 106 and to further refine the ladder shape of the spacers 108. The openings expose portions of a top surface of the hardmask layer 104 and are formed using an etching process such as, for example, a plasma dry etch. The process shown in FIGS. 4A and 4B is a second material removal process (which may be similar or the same as the process described above with respect to FIGS. 3A and 3B) to further define the ladder shaped spacer 108. As shown in FIG. 4A, the fin includes a first fin structure and a second fin structure that are symmetric to each other in a plan view, wherein each of the first and second fin structures includes a main fin extending laterally in a first direction (perpendicular to the X cut line), and first and second extension fins extending laterally from the main fin in a second direction (in the horizontal X cut line direction) perpendicular to the first direction, and wherein the main fin extends laterally in the first direction beyond where the first and second extension fins connect to the main fin.

Figure 5B:
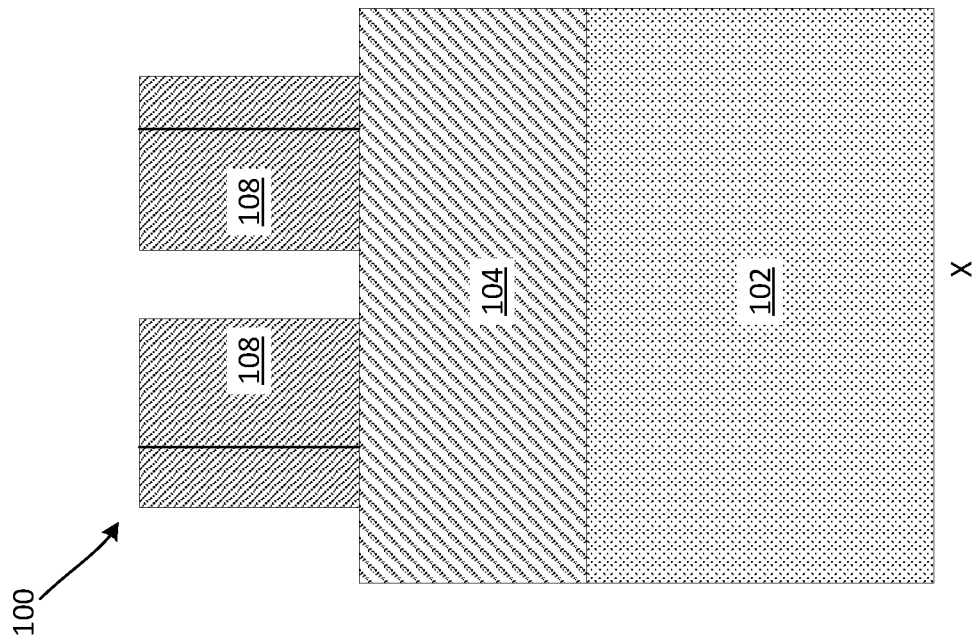
FIGS. 5A and 5B are a top-down view and cross-sectional view of the semiconductor device of FIGS. 4A and 4B respectively after additional fabrication operations, where
Figure 5A:
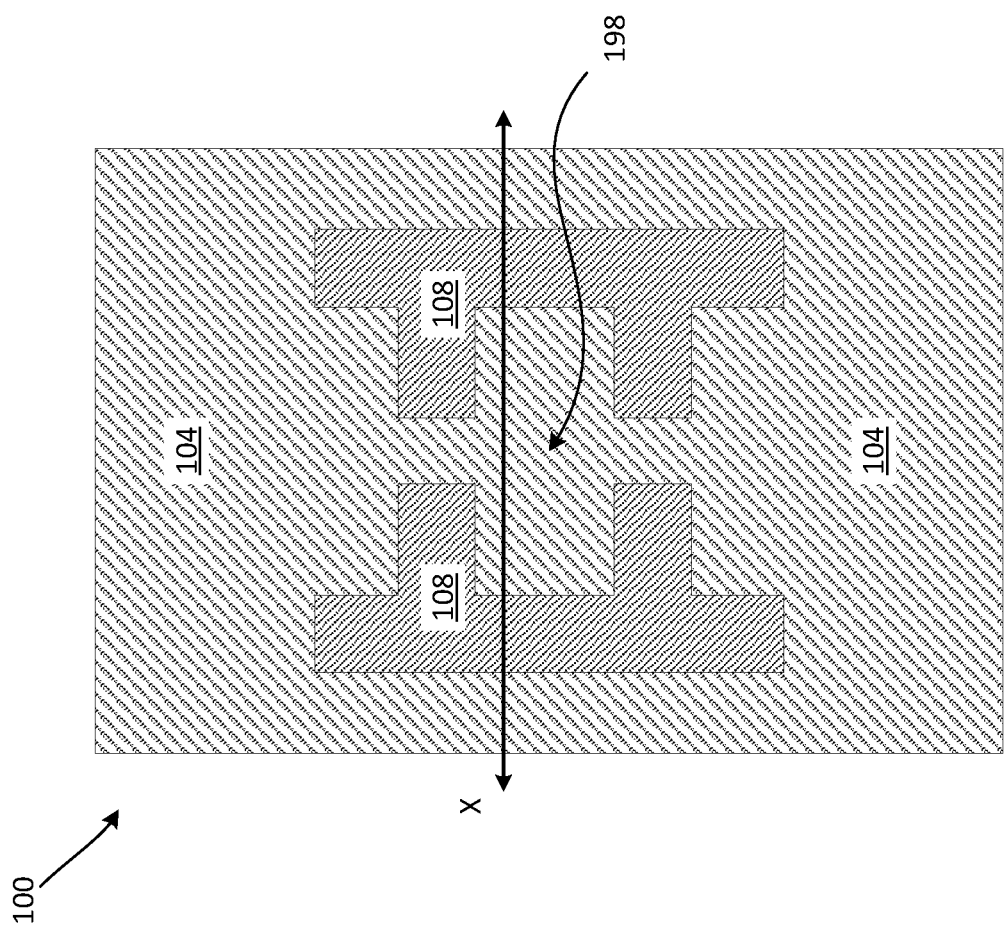

Referring now to FIGS. 5A and 5B, these figures are a top-down view and cross-sectional view of the semiconductor device of FIGS. 4A and 4B respectively after additional fabrication operations, where FIG. 5B is a cross-sectional view of FIG. 5A taken along line X, according to embodiments. As shown in FIGS. 5A and 5B, in order to form the fins 103, the mandrels 106 are selectively removed with respect to the spacers 108. The selective removal of the mandrels 106 is performed using, for example, an isotropic wet or dry etch process. The selective removal of the mandrels 106 leaves the spacers 108 on the hardmask layer 104. Referring to FIG. 5A, the remaining portions of the spacers 108 are ladder shaped, following removal of the central portions as described in connection with FIGS. 4A and 4B, where the ladder shape has been split down the middle to form symmetric right and left sides thereof. That is, the fins 103 (see, FIG. 6B) have a shape corresponding to that of the hardmask layer 104 include a first fin structure and a second fin structure that are symmetric to each other in a plan view. Each of the first and second fin structures includes a main fin extending laterally in a first direction, and first and second extension fins extending laterally from the main fin in a second direction perpendicular to the first direction, and the main fin extends laterally in the first direction beyond where the first and second extension fins connect to the main fin. Also, for each of the first and second fin structures, the first and second extension fins extend from the main fin toward a center 198 (see, FIG. 5A) of the fin 103.

Figure 6B:
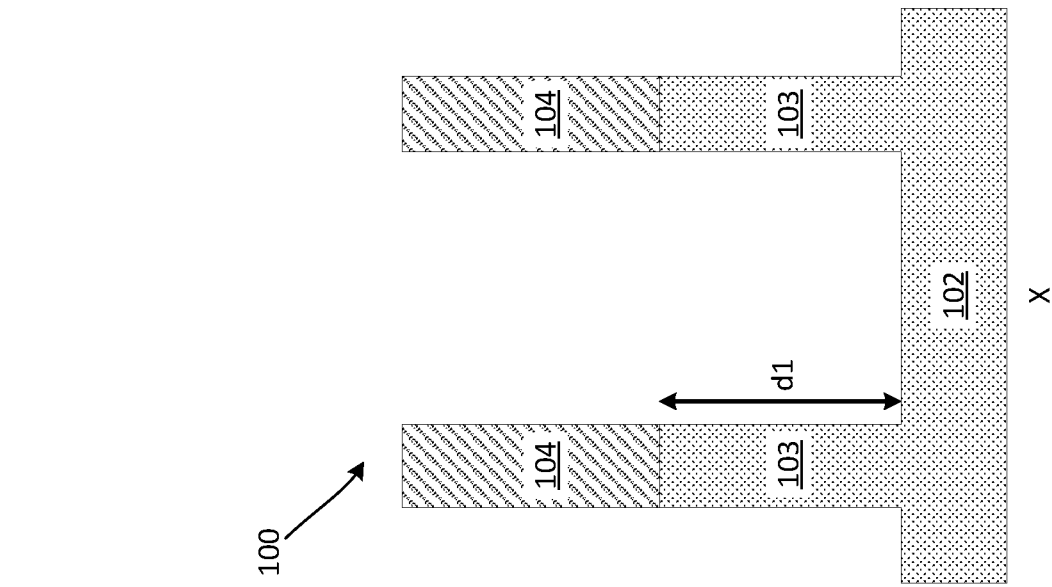
FIGS. 6A and 6B, these figures are a top-down view and cross-sectional view of the semiconductor device of FIGS. 5A and 5B respectively after additional fabrication operations that include patterning the hardmask layer, where
Figure 6A:
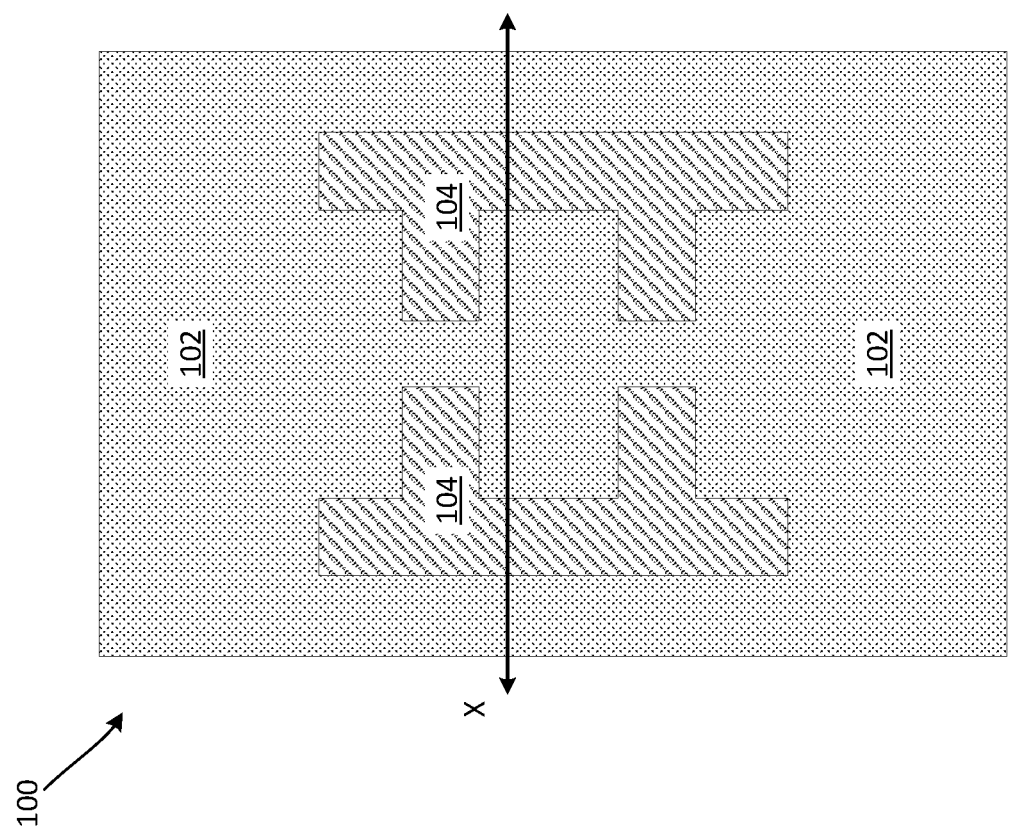

Referring now to FIGS. 6A and 6B, these figures are a top-down view and cross-sectional view of the semiconductor device of FIGS. 5A and 5B respectively after additional fabrication operations that include patterning the hardmask layer, where FIG. 6B is a cross-sectional view of FIG. 6A taken along line X, according to embodiments. As shown in FIGS. 6A and 6B, the hardmask layer 104 is patterned into a plurality of patterned hardmask portions corresponding to the locations of the overlying spacers 108 (as shown in FIGS. 5A and 5B) so that the underlying patterned hardmask layer 104 portions have the same split ladder shape of the spacers 108. More specifically, exposed portions of the hardmask layer 104 not under the spacers 108 (e.g., not masked by the spacers 108) are removed using, for example, a directional etching process, comprising RIE using $CF_8$, $CH_2F_2$ or other suitable chemistry as is known to etch, for example, silicon nitride selective to other materials. The patterning of the hardmask layer 104 into the plurality of patterned hardmask layer 104 portions spaced apart from each other can be performed using, for example, self-aligned multi-patterning (SAMP) techniques, including, but not necessarily limited to, self-aligned double patterning (SADP), self-aligned quadruple patterning (SAQP) and self-aligned octuple patterning (SAOP).

Following removal of the spacers 108, using the patterned hardmask layer 104 portions as masks, exposed portions of the substrate 102 not covered by the hardmask portions 104 are removed to certain depth d1 (depending on design) using a substrate etch. The substrate etch transfers the pattern of the hardmask portions 104 to the substrate to form the fins 103, which have the same split ladder shape as the overlying hardmask layer 104 portions. In accordance with an embodiment, substrate 102 including a semiconductor material, such as, Si, SiGe, SiC, Si:C, SiGeC, SiGe:C, II-V compound semiconductor or other like semiconductor, can be selectively etched with respect to the hardmask portions 104 using, for example, a silicon RIE process.

While embodiments of the present disclosure describe channel regions as fins, the embodiments are not necessarily limited to fin channel regions, and may include nanowire channel regions. In addition, although two fins 103 are shown in the figures for ease of explanation, more or less than two fins can be formed.

Figure 7:
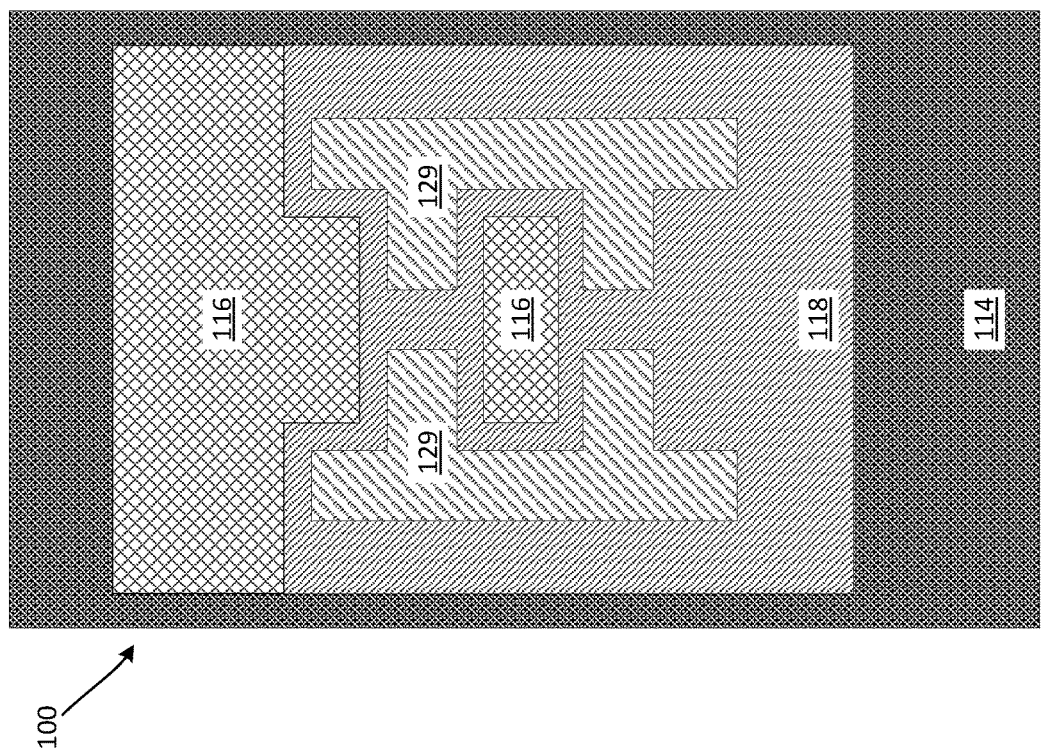
FIG. 7 is a top-down view of the semiconductor device of FIGS. 6A and 6B after additional fabrication operations, according to embodiments.

Referring now to FIG. 7, this figure is a top-down view of the semiconductor device of FIGS. 6A and 6B after additional fabrication operations, according to embodiments. As shown in FIG. 7, a bottom epitaxial layer 129 is formed on the fins 103, and a first interlayer dielectric (ILD) layer 114 is formed on the substrate 102. The bottom epitaxial layers 129, at least portions of which may function as bottom source/drain regions (or the bottom source/drain), can be in-situ doped, meaning dopants are incorporated into the epitaxy film during the epitaxy process. Other alternative doping techniques can be used, including but not necessarily limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. Although not shown in FIG. 7, a bottom spacer layer 122 (see also, FIGS. 8B and 8C) is formed on the ILD layer 114. Then, a gate electrode 118 (or gate) is formed on the bottom spacer layer 122 and on and around portions of the fins 103 (see also, FIGS. 8B and 8C). A top spacer layer 128 is formed on the gate electrode 118 and on upper vertical portions of the fins 103 (see also, FIGS. 8B and 8C). Active regions 116 of the VTFET semiconductor device 100 are also indicated in FIG. 7. In certain embodiments, forming the VTFET semiconductor device 100 includes comprising forming an epitaxial layer on the fin in a region of the fin in the plan view excluding extension regions where the main fin extends laterally in the first direction beyond where the first and second extension fins connect to the main fin. In certain embodiments, forming the VTFET semiconductor device 100 includes forming an epitaxial layer on the fin in a region of the fin in the plan view excluding extension regions where the main fin extends laterally in the first direction beyond where the first and second extension fins connect to the main fin.

Figure 8A:
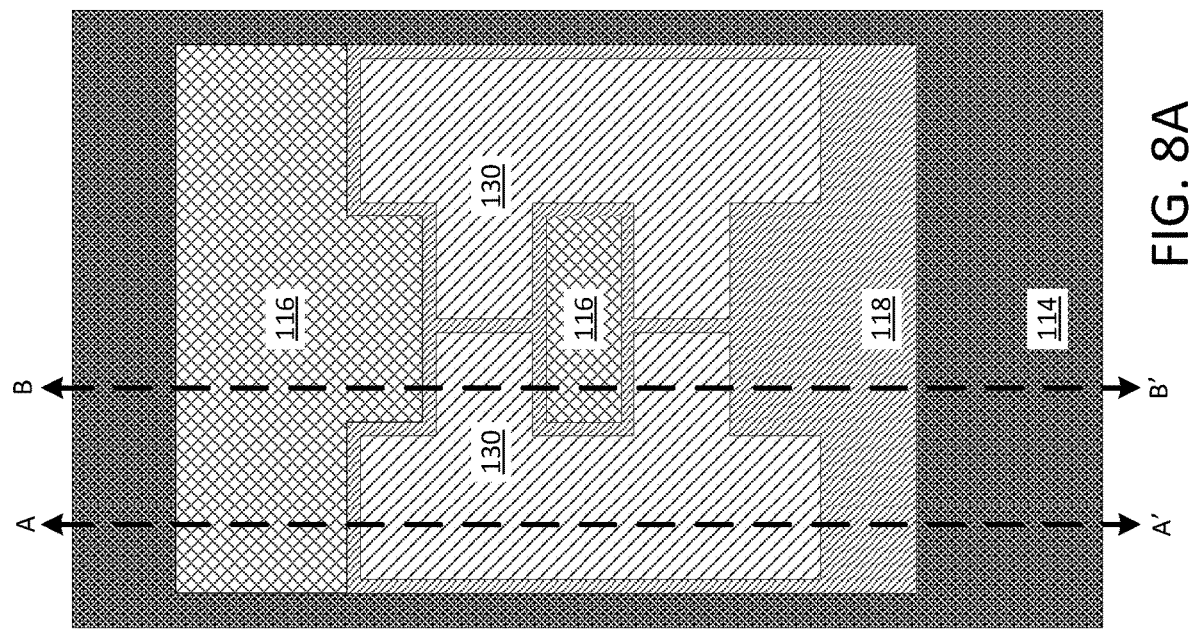
FIGS. 8A, 8B and 8C are a top-down view and two different cross-sectional views, respectively, of the semiconductor device of FIG. 7 after additional fabrication operations, where
Figure 8B:
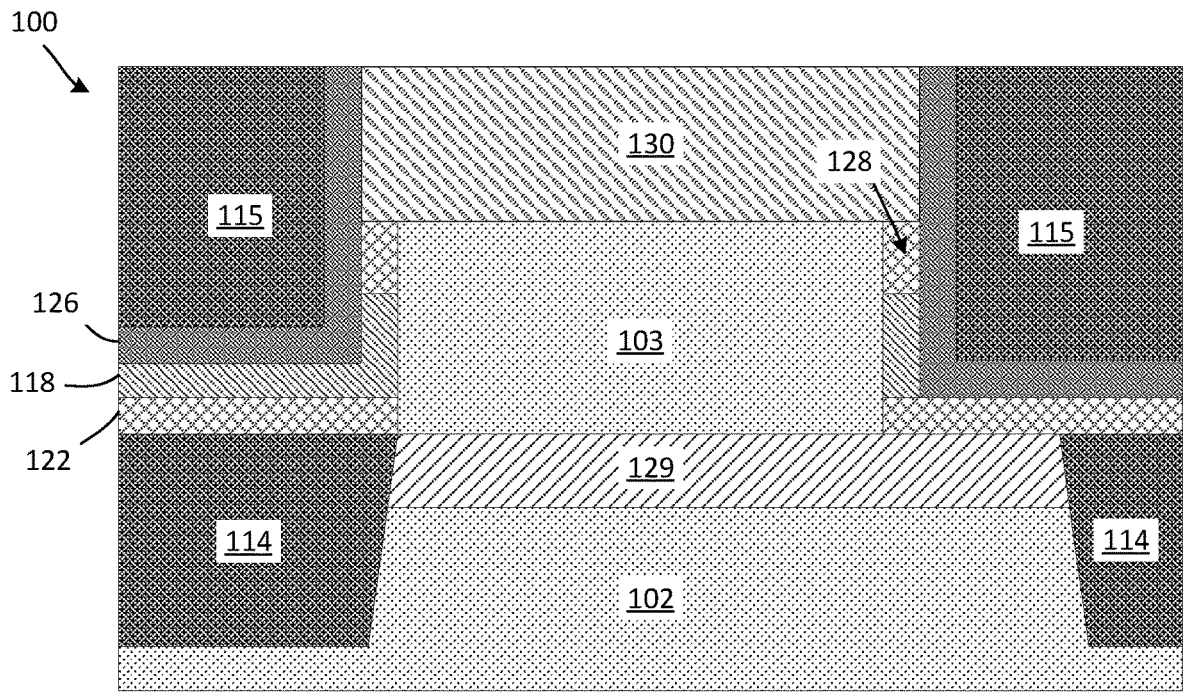
Figure 8C:
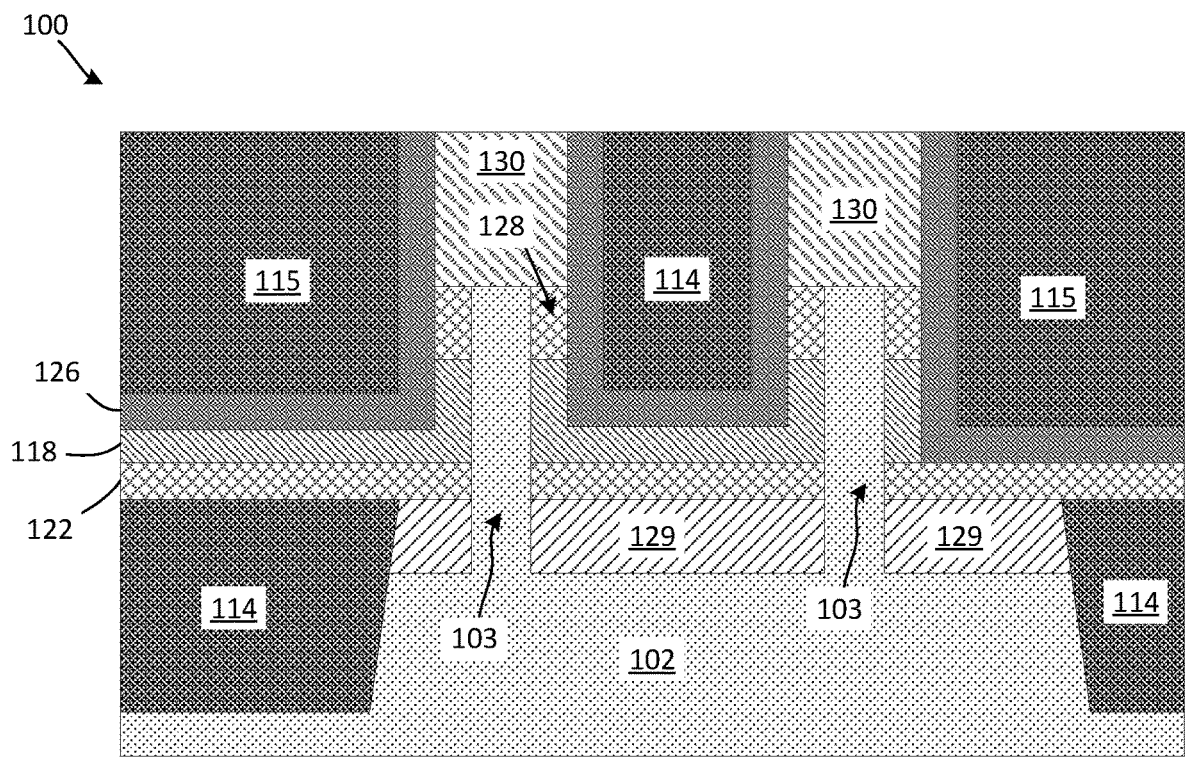

Referring now to FIGS. 8A, 8B and 8C, these figures are a top-down view and two different cross-sectional views of the semiconductor device of FIG. 7 after additional fabrication operations, where FIG. 8B is a cross-sectional view of FIG. 8A taken along line A-A', and where FIG. 8C is a cross-sectional view of FIG. 8A taken along line B-B', according to embodiments. As shown in FIG. 8A, a top epitaxial layer 130 is formed on the upper surface of the fins 103. Top source/drain regions (i.e., at least portions of the top epitaxial layer 130) are epitaxially grown in an epitaxial growth process from the upper portions of the fins 103. Similar to the bottom source/drain regions, the epitaxially grown top source/drain regions (or the top source/drain) can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc. Dopants may include, for example, n-type or p-type dopants at various concentrations the same or similar to those used for the bottom source/drain regions depending on whether the device is an n-type or p-type device.

As shown in FIG. 8B, a liner layer 126 is formed on the gate electrode 118 and extends up to cover sidewalls of the top spacer layer 128 and the top epitaxial layer 130. The liner layer 126 is a thin layer comprised of an insulating material such as, for example, SiN. It should be appreciated that the liner may be comprised of any suitable material that enables protection of the gate from oxidation. A second ILD layer 115 is then formed by a suitable material deposition process. The various layers shown in FIG. 7 and in FIGS. 8A, 8B and 8C may be deposited and patterned by a suitable combination of the deposition, lithographic and material removal processes described above. In some embodiments, a planarization process, such as, chemical mechanical planarization (CMP) can be used to remove excess material of the top epitaxial layer 130, the second ILD layer, and the liner layer 126.

Figure 9A:
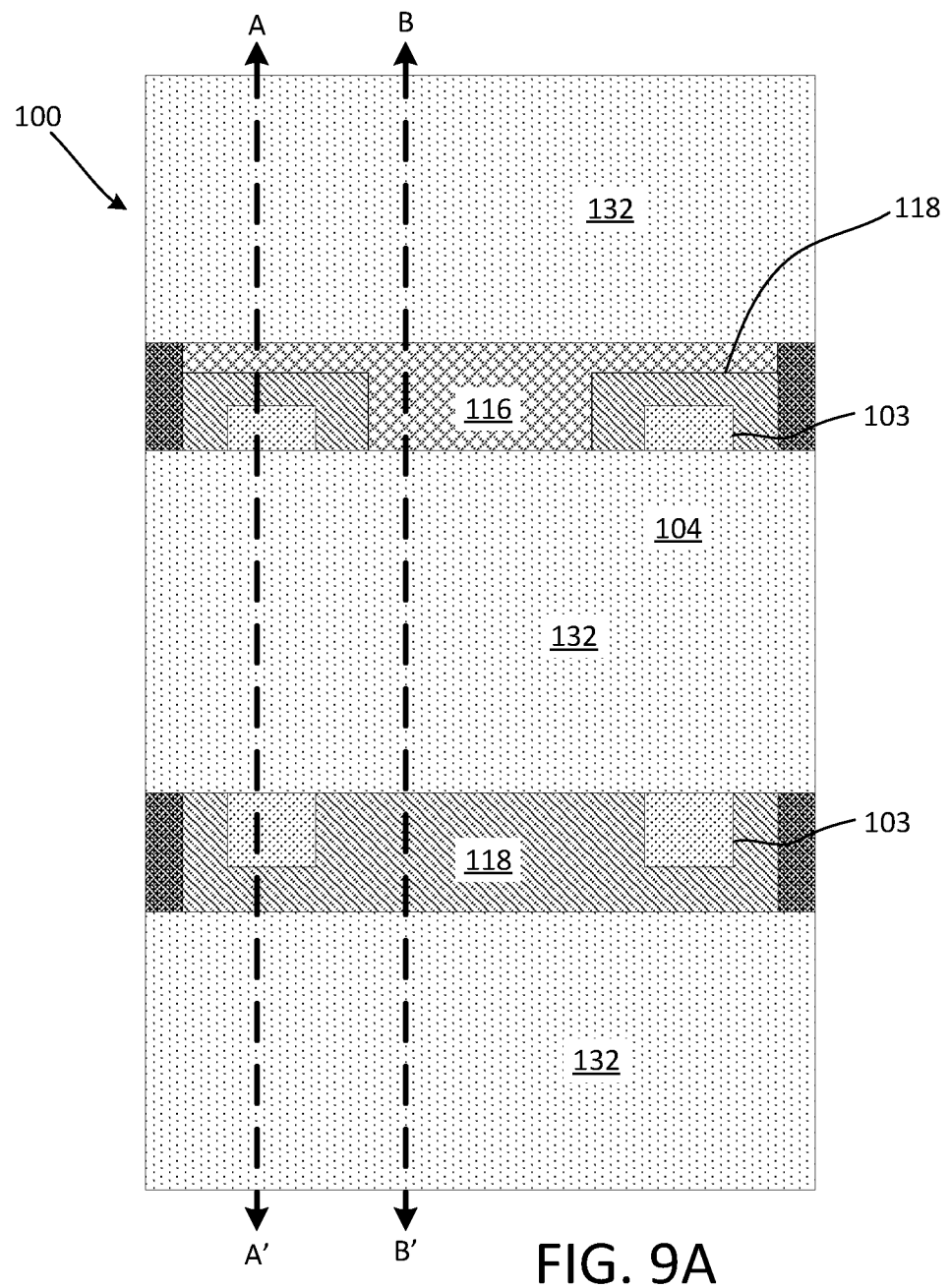
FIGS. 9A, 9B and 9C are a top-down view and two different cross-sectional views, respectively, of the semiconductor device of FIGS. 8A, 8B and 8C after additional fabrication operations, where
Figure 9B:
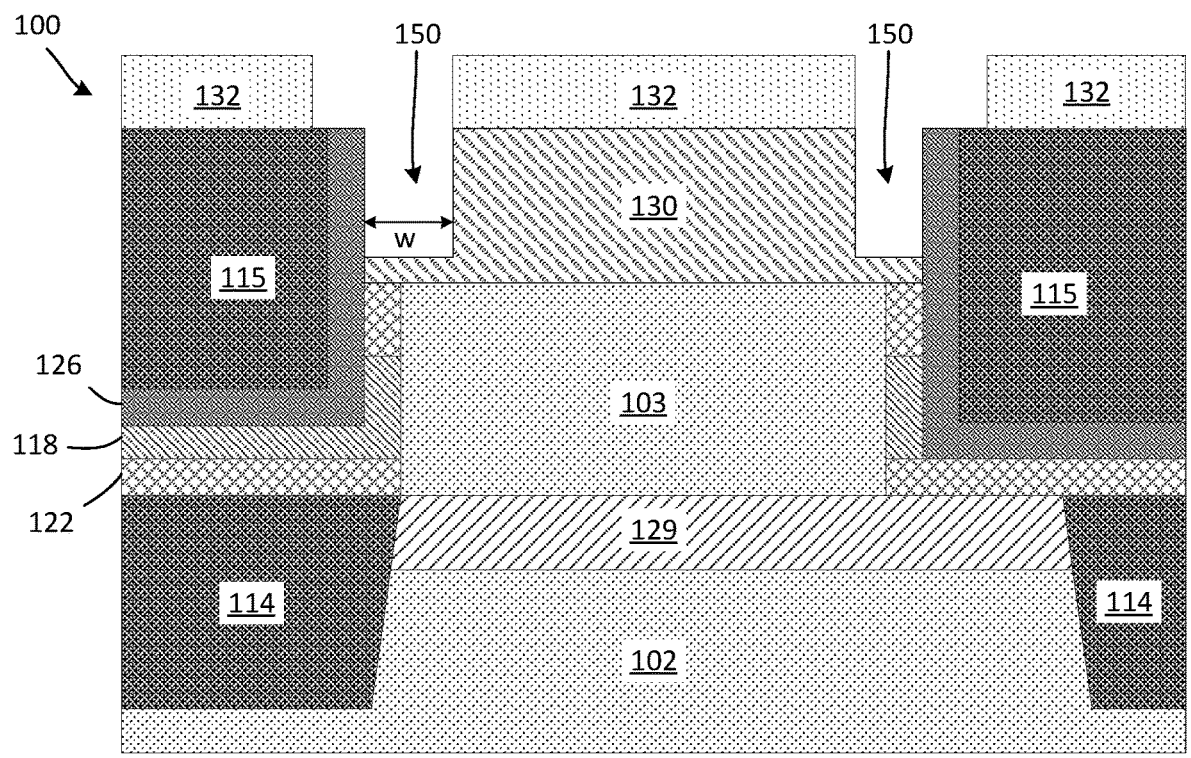
Figure 9C:
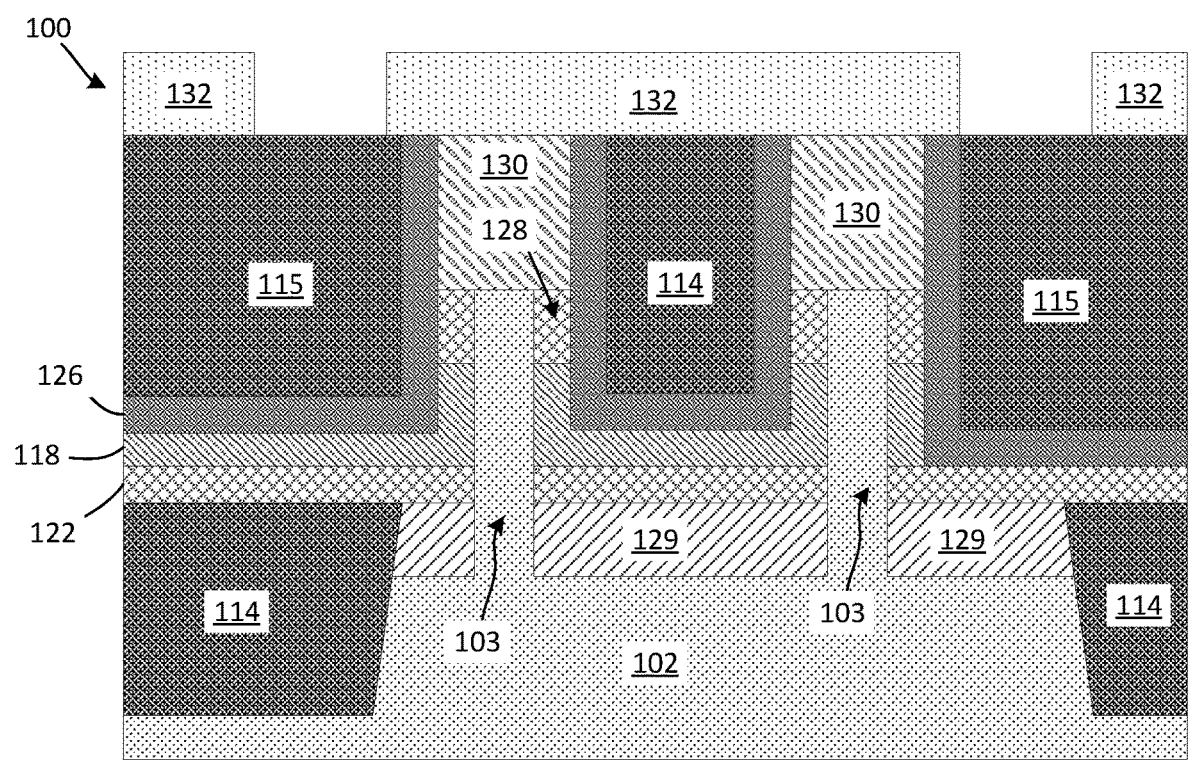
Figure 10A:
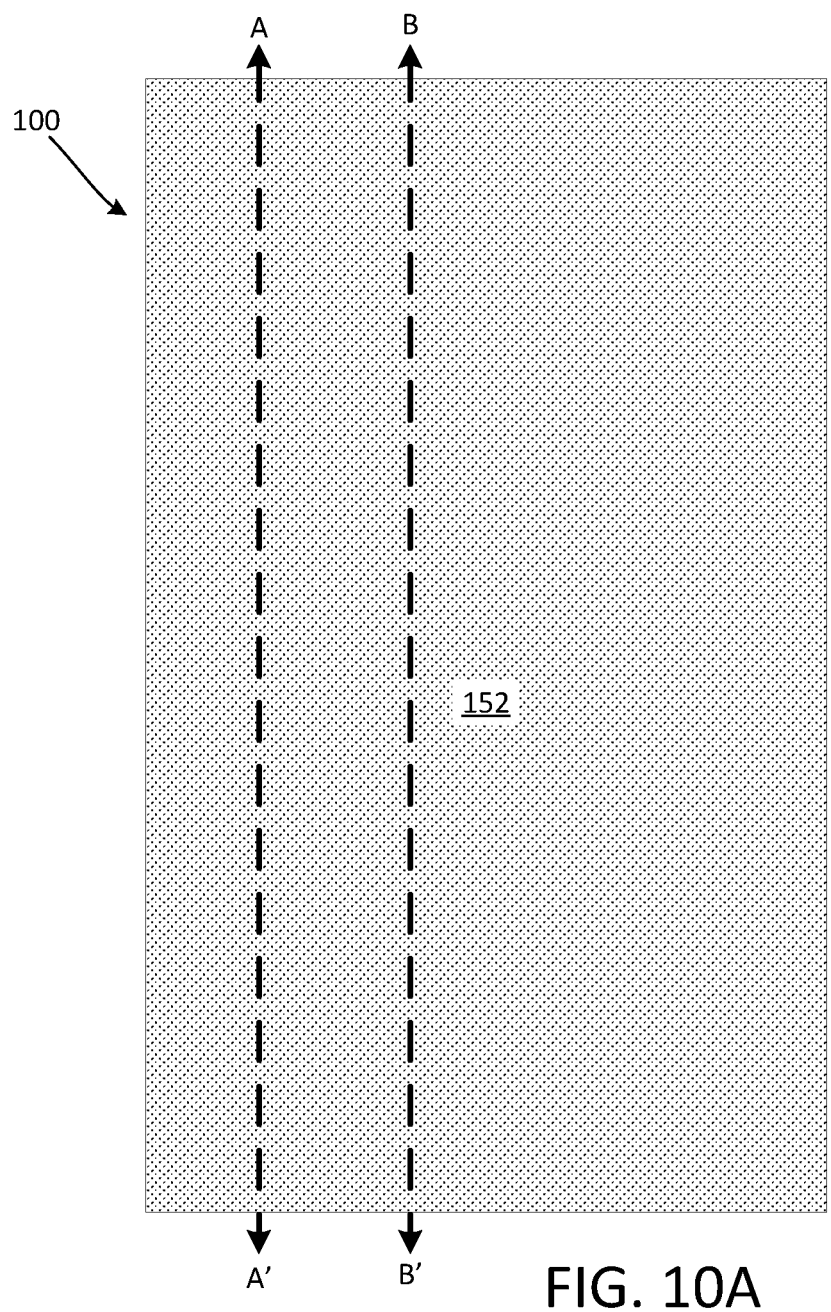

Referring now to FIGS. 9A, 9B and 9C, these figures are a top-down view and two different cross-sectional views of the semiconductor device of FIGS. 8A, 8B and 8C after additional fabrication operations, where FIG. 9B is a cross-sectional view of FIG. 9A taken along line A-A', and where FIG. 9C is a cross-sectional view of FIG. 9A taken along line B-B', according to embodiments. As shown in FIG. 9A, a mask 132 is deposited over the semiconductor device 100 to allow for selective removal of portions of the top epitaxial layer 130. As shown in FIG. 9A, the mask does not cover certain portions of the gate electrode 118, the top epitaxial layer 130 and portion of the active regions 116 of the semiconductor device 100. As shown in FIGS. 9A and 9B, a selective etching process is performed to remove portions of the top epitaxial layer 130 and to form spaces 150 for subsequent deposition of a dielectric fill material, thereby exposing small portions of the underlying fins 103 and possibly also portions of the top spacer layer 128. The etchant may be appropriately selected so that the material of the top epitaxial layer 130 is removed whereas the SiN of the liner layer 126 and the material of the second ILD layer 115 are not removed (or barely removed). It should also be appreciated that in certain embodiments, as shown in FIG. 9B, most of the thickness of the top epitaxial layer 130 is removed by etching, but a small thickness of the layer may be left so as to not expose the fins 103. There may also be a conductive layer on top of the fin 103 to fully utilize the gate width. As shown in the cross-sectional view of FIG. 9C, along cut line B-B' the shape of the mask 132 as well as the ladder shape of the fins 103 does not allow for any etching of the top epitaxial layer 130 in this area. Thus, the only portion of the top epitaxial layer 130 that is removed by the etching process is the top and bottom extension portions corresponding to the ladder shape of the underlying fins 103 (where the shape of the top epitaxial layer 130 generally corresponds to the shape of the fins 103). Thus, there is an effect that the rungs (or portions of the top epitaxial layer 130 extending inward toward the center of the ladder shaped region) are not removed, thereby resulting in increased surface area of the top epitaxial layer 130. As mentioned above, in certain semiconductor devices, the top epitaxial layer may need to be cut to leave a suitable margin for the CB and CR landing (where the CB landing is for the gate contact and the CR landing is for the bottom S/D contact). However, with the removal of portions of the top epitaxial layer for a VFET, the CFET may suffer from a transistor on-state resistance ($R_{on}$) degradation due to the fact that the epitaxial layer is not grown in a part of the fin. Thus, the device may suffer from a large device asymmetry due to this material removal process. However, according to the present embodiments, the ladder shape of the fins 103 (and corresponding ladder shape of the top epitaxial layer 130) has an effect that during the etching process only small amounts of the top epitaxial layer 130 at the very top and bottom of the ladder shape are removed, and the rung portions extending towards the middle are not removed. As also shown in FIG. 9B, after the etching process is performed, there is a distance w between the top epitaxial layer 130 and the liner layer 126 corresponding to the spaces 150. This is later filled with a dielectric material as shown in FIGS. 10A, 10B and 10C. This additional dielectric material separates the top epitaxial layer 130 from the subsequently formed metal contacts, which may reduce the likelihood of electrical shorting therebetween.

Referring now to FIGS. 10A, 10B and 10C, these figures are a top-down view and two different cross-sectional views of the semiconductor device of FIGS. 9A, 9B and 9C after additional fabrication operations including deposition of a dielectric fill layer, where FIG. 10B is a cross-sectional view of FIG. 10A taken along line A-A', and where FIG. 10C is a cross-sectional view of FIG. 10A taken along line B-B', according to embodiments. As shown in FIGS. 10A, 10B and 10C, a dielectric fill layer 152 is deposited in the spaces 150 between the top epitaxial layer 130 and the liner layer 126. In some embodiments, a planarization process, such as, chemical mechanical planarization (CMP) can be used to remove excess material of the dielectric fill layer 152.

Figure 11A:
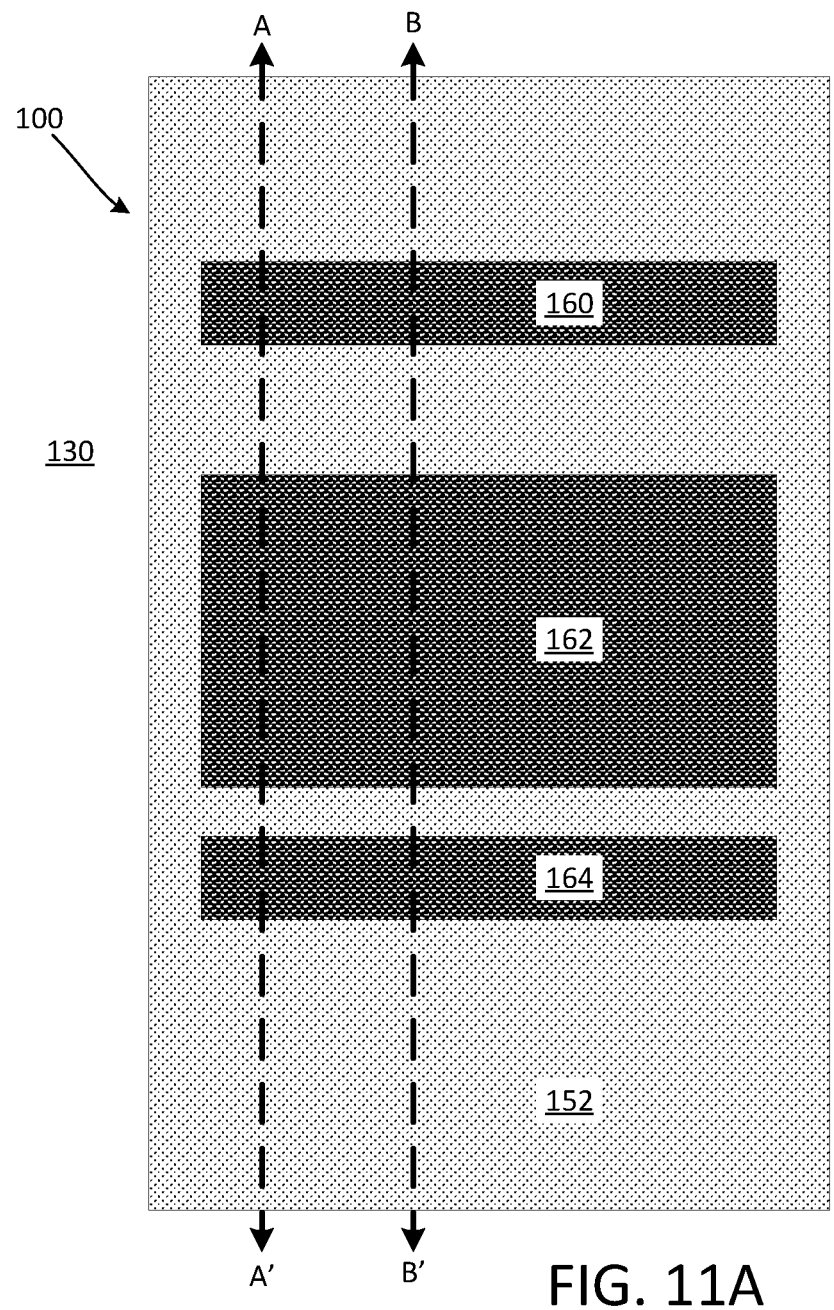
FIGS. 11A, 11B and 11C are a top-down view and two different cross-sectional views of the semiconductor device of FIGS. 10A, 10B and 10C after additional fabrication operations including formation of vias and metal contacts, where
Figure 11B:
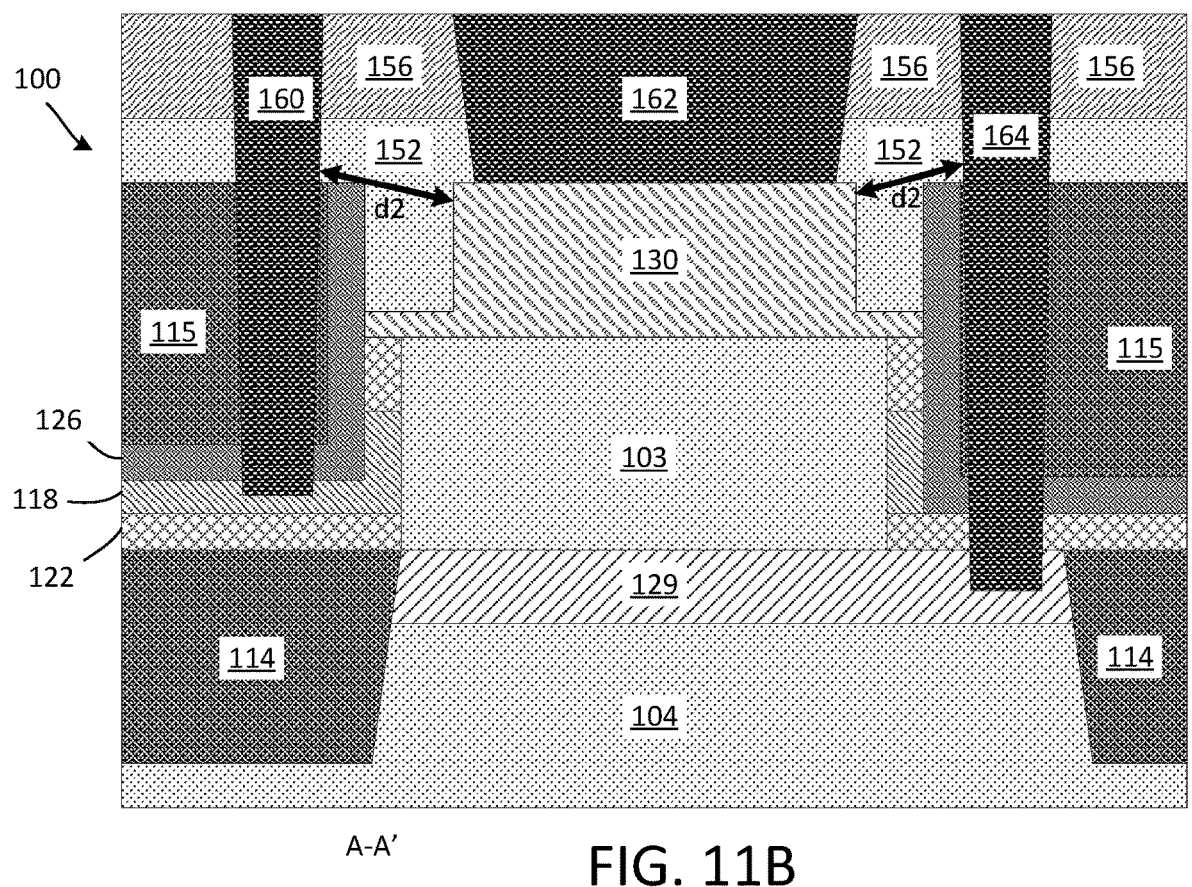
Figure 11C:
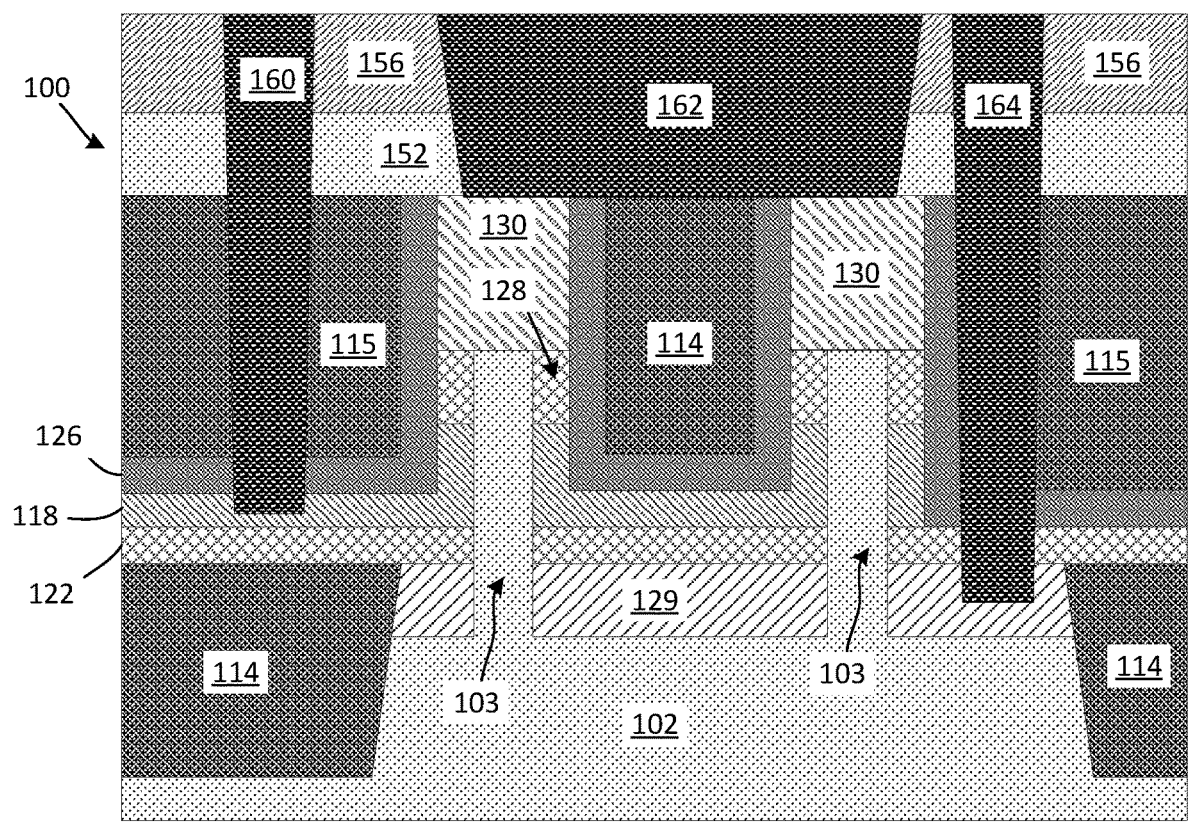

Referring now to FIGS. 11A, 11B and 11C, these figures are a top-down view and two different cross-sectional views of the semiconductor device of FIGS. 10A, 10B and 10C after additional fabrication operations including formation of vias and metal contacts, where FIG. 11B is a cross-sectional view of FIG. 11A taken along line A-A', and where FIG. 11C is a cross-sectional view of FIG. 11A taken along line B-B', according to embodiments. Although not shown in FIGS. 10A, 10B and 10C, vias are first formed through several layers of the semiconductor device 100 to allow for formation of the metal contacts. As shown in FIG. 11B, the first contact 160 is formed down to the level of the gate electrode 118, the second contact is formed down to the level of the top epitaxial layer 130, and the third contact is formed down to the level of the bottom epitaxial layer 129. As discussed above, the extra insulating material of the dielectric fill layer 152 creates a distance d2 between the top epitaxial layer 130 and the first contact 160, and between the top epitaxial layer 130 and the second contact 164, thereby reducing the likelihood of an electrical short.

Thus, according to the present embodiments, by providing ladder shaped fins 103, material removal of the top epitaxial layer 130 during the epi cut may be minimized, thereby resulting in an increased surface area of the top epitaxial layer 130. Therefore, the VFET may not suffer from transistor on-state resistance ($R_{on}$) degradation due to the fact that the top epitaxial layer 130 is not grown in a part of the fin 103.

Figure 12:
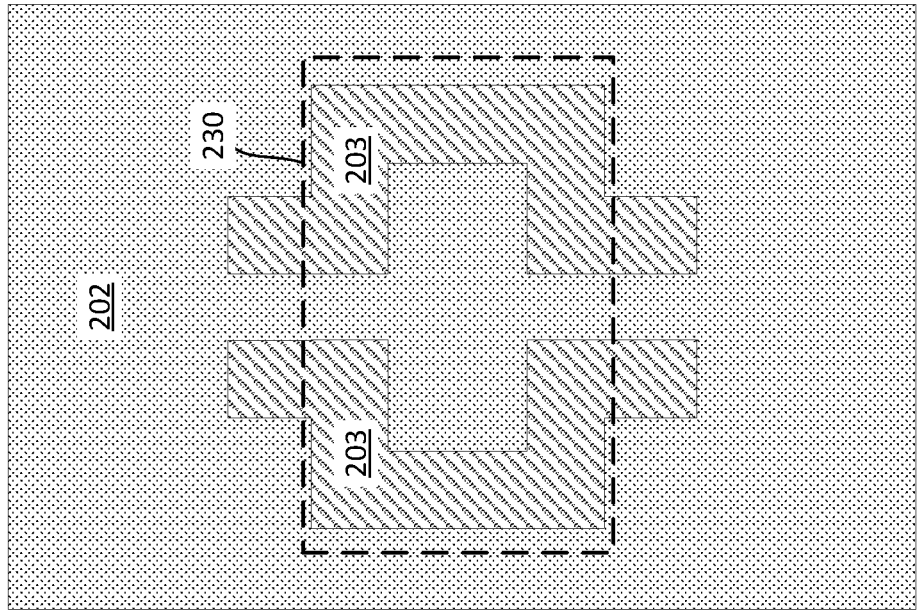
FIG. 12 is a top-down view of a semiconductor device with differently shaped fins relative to the embodiments discussed above with respect to FIGS. 1-11C, according to embodiments.

Referring now to FIG. 12, this figure is a top-down view of a semiconductor device with differently shaped fins relative to the embodiments discussed above with respect to FIGS. 1-11C, according to embodiments. As shown in FIG. 12, a semiconductor device 200 is provided with a substrate 202 and fins 203. In contrast to the embodiments of FIGS. 1-11C, the portions of the fins 203 that are outside the area where the top epitaxial layer 230 is provided are closer to the center of the device. Although this is a somewhat different shape for the fins, it should be appreciated that the same or similar effects can be achieved because only very minor portions of the top epitaxial layer 230 are removed during the epi cut. In certain embodiments, the process for producing the semiconductor device 200 is generally the same as in the embodiments of FIGS. 1-11C and is not repeated here for the sake of brevity.

Figure 13:
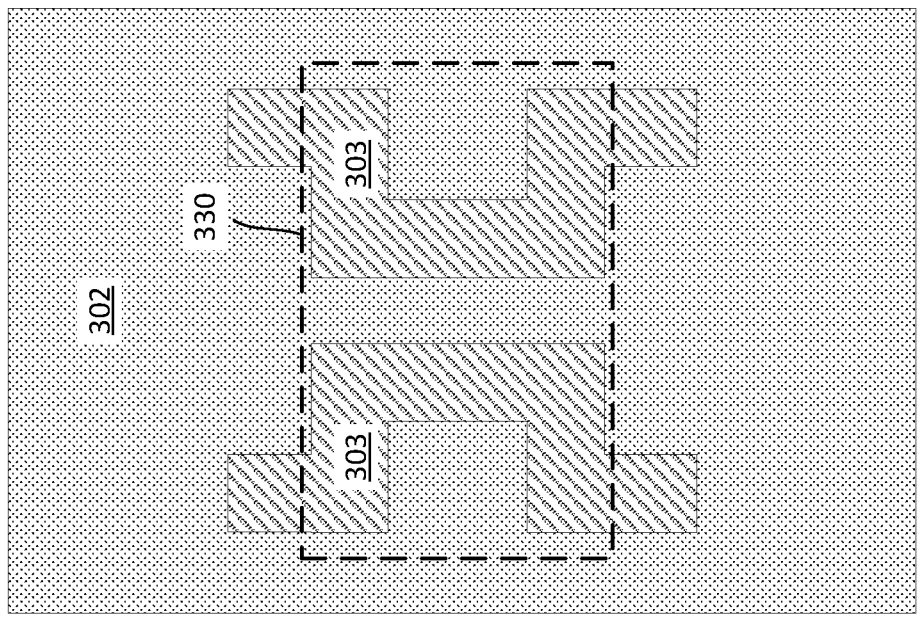
FIG. 13 is a top-down view of a semiconductor device with differently shaped fins relative to the embodiments discussed above with respect to FIGS. 1-11C, according to embodiments.

Referring now to FIG. 13, this figure is a top-down view of a semiconductor device with differently shaped fins relative to the embodiments discussed above with respect to FIGS. 1-11C, according to embodiments. As shown in FIG. 13, a semiconductor device 300 is provided with a substrate 302 and fins 303. In contrast to the embodiments of FIGS. 1-11C, the central portions of the fins 303 that are inside the area where the top epitaxial layer 230 is provided are closer to the center of the device. Although this is a somewhat different shape for the fins, it should be appreciated that the same or similar effects can be achieved because only very minor portions of the top epitaxial layer 330 are removed during the epi cut. In certain embodiments, the process for producing the semiconductor device 300 is generally the same as in the embodiments of FIGS. 1-11C and is not repeated here for the sake of brevity.

Figure 14:
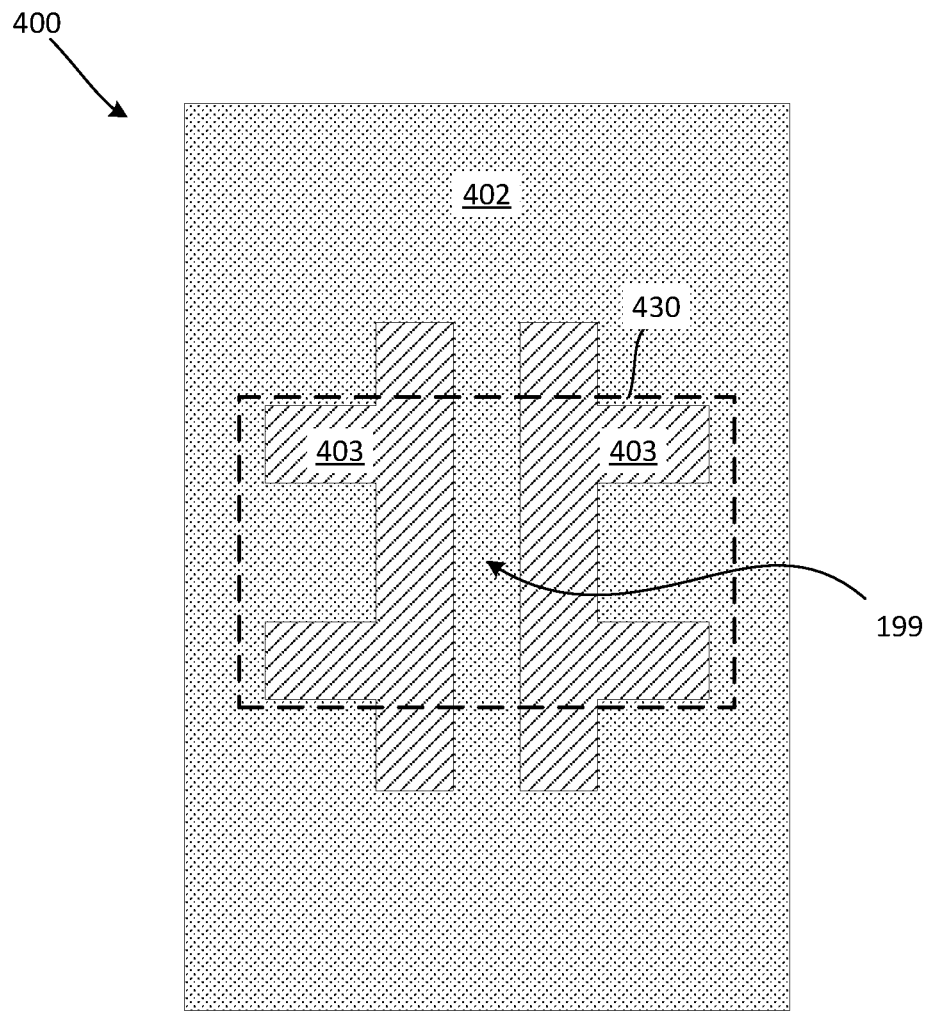
FIG. 14 is a top-down view of a semiconductor device with differently shaped fins relative to the embodiments discussed above with respect to FIGS. 1-11C, according to embodiments.

Referring now to FIG. 14, this figure is a top-down view of a semiconductor device with differently shaped fins relative to the embodiments discussed above with respect to FIGS. 1-11C, according to embodiments. As shown in FIG. 14, a semiconductor device 400 is provided with a substrate 402 and fins 403. In contrast to the embodiments of FIGS. 1-11C, the portions of the fins 403 that are outside the area where the top epitaxial layer 430 is provided, and the central portions of the fins 403 inside the area where the top epitaxial layer 430 is provided are both closer to the center of the device. Thus, the shape of the fins 403 has somewhat of a mirrored configuration to the fins 103 in the embodiments of FIGS. 1-11C. Although this is a somewhat different shape for the fins, it should be appreciated that the same or similar effects can be achieved because only very minor portions of the top epitaxial layer 430 are removed during the epi cut. In certain embodiments, the process for producing the semiconductor device 400 is generally the same as in the embodiments of FIGS. 1-11C and is not repeated here for the sake of brevity. As shown in FIG. 14, for each of the first and second fin structures, the first and second extension fins extend from the main fin away from a center of the fin.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a bottom source/drain;
a top source/drain; and
a fin provided between the bottom source/drain and the top source/drain, the fin including a first fin structure and a second fin structure that vertically extend from a substrate, the vertical extending portions of the first and second fin structures spaced apart from each other, and that are symmetric to each other in a plan view,
wherein each of the first and second fin structures includes a main fin extending laterally in a first direction, and first and second extension fins extending laterally from the main fin in a second direction perpendicular to the first direction, and wherein the main fin extends laterally in the first direction beyond where the first and second extension fins connect to the main fin.

2. The semiconductor device according to claim 1, wherein for each of the first and second fin structures, the first and second extension fins extend from the main fin toward a center of the fin.

3. The semiconductor device according to claim 1, wherein for each of the first and second fin structures, the first and second extension fins extend from the main fin away from a center of the fin.

4. The semiconductor device according to claim 1, wherein the semiconductor device is a vertical transport field effect transistor (VTFET).

5. The semiconductor device according to claim 1, further comprising an epitaxial layer provided on the fin, the epitaxial layer having portions removed to form spaces in extension regions where in plan view the main fin extends laterally in the first direction beyond where the first and second extension fins connect to the main fin.

6. The semiconductor device according to claim 5, wherein a top source/drain region is provided in the epitaxial layer.

7. The semiconductor device according to claim 5, further comprising a dielectric material provided in the spaces formed in the epitaxial layer.

8. The semiconductor device according to claim 1, further comprising:
 a gate electrode provided in contact with the fin; and
 a liner layer provided on the gate electrode.

9. The semiconductor device according to claim 8, wherein the liner layer comprises an insulating material.

\* \* \* \* \*